Figure 1:
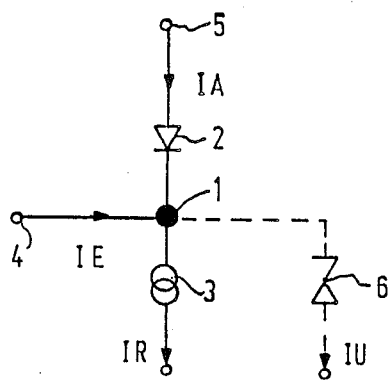

United States Patent [19]

Wölber et al.

[11] Patent Number: 4,868,429

[45] Date of Patent: Sep. 19, 1989

[54] CIRCUIT ARRANGEMENT FOR GENERATING A LIMITED CURRENT

[75] Inventors: Jörg Wölber, Pinneberg; Klaus G. Kröner, Hamburg, both of Fed. Rep. of Germany

[73] Assignee: U.S. Philips Corporation, New York, N.Y.

[21] Appl. No.: 325,095

[22] Filed: Mar. 15, 1989

Related U.S. Application Data

[63] Continuation of Ser. No. 131,784, Dec. 11, 1987, abandoned.

[30] Foreign Application Priority Data

Dec. 13, 1986 [DE]   Fed. Rep. of Germany ....... 3642618

[51] Int. Cl.⁴ ............................................. H03K 5/08
[52] U.S. Cl. .................................... 307/540; 307/544; 307/555
[58] Field of Search ............... 307/540, 544, 549, 551, 307/559, 567, 256, 259

[56] References Cited

U.S. PATENT DOCUMENTS

| | | | |
|---|---|---|---|
| 3,760,196 | 9/1973 | Nomoto et al. | 307/544 |
| 4,066,914 | 1/1978 | Gundry | 307/264 |
| 4,495,429 | 1/1985 | Oda et al. | 307/549 |
| 4,709,171 | 11/1987 | Main | 307/567 |

FOREIGN PATENT DOCUMENTS 0134914   8/1984   Japan .................... 307/544

Primary Examiner—John Zazworsky
Attorney, Agent, or Firm—David R. Treacy

[57] ABSTRACT

A circuit arrangement for deriving an output current from an input current, which output current is limited to a current range which is bounded by at least one limit value. It is possible to limit high-frequency currents by avoiding current distributions or saturation effects in that the circuit arrangement comprises a current combination element (1) for forming an at least substantially linear combination of the input current (IE), the output current (IA) and a fixed reference current (IR) and by at least a rectifier circuit (2) arranged in the current path of the input current (IE) and/or the output current (IA).

20 Claims, 6 Drawing Sheets

CIRCUIT ARRANGEMENT FOR GENERATING A LIMITED CURRENT

This is a continuation of application Ser. No. 131,784, filed Dec. 11, 1987; now abandoned.

The invention relates to a circuit arrangement for deriving an output current from an input current, which output current is limited to a current range which is bounded by at least one limit value.

A current limiter and a method of limiting the current through a transistor which is driven by a prearranged amplifier stage are described in the international Patent Application WO 83/04351. The current limiter described in this Application includes an additional transistor whose base and emitter terminals are connected to the base and emitter terminals of the transistor whose current is to be limited. A current source supplies a given current to the collector of the additional transistor. The additional transistor is saturated if a limiting threshold is reached when the value of the drive current supplied to the base terminals of the two transistors exceeds a value at which the current source can no longer supply the collector current required by the additional transistor.

By distributing the current to be limited from the preceding amplifier stage over the base terminals of the two transistors, the current to be limited is attenuated on the one hand and on the other hand a spread occurs in the distribution ratio and hence in the transmission ratio, which spread is caused by device tolerances. These tolerances have a considerable effect, particularly in the case of transistors which are dimensioned quite differently. Moreover, the additional transistor which is being saturated affects the transmission of the current to be limited. The charge flowing in the additional transistor in the case of saturation form a hardly controllable parallel capacitance, which deteriorates the transmission characteristic, particularly at currents of a higher frequency. When integrating the entire current limiter on a semiconductor wafer, uncontrolled substrate currents occur if one of the integrated transistors is saturated. This may result in an unreliable behaviour of the entire integrated circuit.

It is the object of the invention to provide a circuit arrangement of the type described in the opening paragraph enabling high frequency currents to be limited without the occurrence of signal distortions due to, for example distributions of the currents to be limited or saturation effects in the semiconductor components used.

In a circuit arrangement according to the invention this object is solved by a current combination element for forming an at least substantially linear compensation of the input current, the output current and a fixed reference current and by at least one rectifier circuit arranged in the current path of the input current and/or the output current.

The circuit arrangement according to the invention is based on the recognition that an output current can firstly be made to be linearly dependent on an input current in that a linear combination of these two currents is rendered equal to a constant, i.e. a fixed reference. As the input current is then varied, the output current linearly changes with the opposite sign. If the direction of the input current or the output current is fixed, the range of values of the other current is also limited on one side. Such a current limitation can only be achieved by using a constant current source for the fixed reference current and a rectifier curcuit for one of the two other currents. In that case neither a division in the input current nor a saturation effect occurs in the components. A very direct, low-distortion transmission of the input current to the output current, which is also suitable for limiting signal currents of a very high frequency, is then obtained.

The circuit arrangement according to the invention may be preferably used in signal limiter circuits, synchronizing signal separator circuits, reduction circuits in comb filters or circuits for non-linear pre- and de-emphasis for video signal processing in video recorders. In such arrangements which are usually driven with a voltage controller, an increase of the processable signal frequency with a simultaneous reduction of the current consumption and the power supply voltage can be achieved by means of current control rather than the voltage control. This provides the possibility of advantageously realising circuit arrangements for processing signals of very low signal voltages.

Advantageously, the current combination element and the rectifier circuit are comprised in a current mirror arrangement, a part of the currents forming an at least substantially linear combination being applied to the first current branch of said arrangement and the other part of said currents being applied to the second current branch of said arrangement. This provides the possibility of easily adapting the combinations of the currents and their flow directions to the requirements imposed by circuit components with which the current limitation is to co-operate. For example, it is easy to supply reference currents via a current mirror circuit, which currents are already required and generated for other purposes at other locations in a larger circuit. For example, if in its simplest form such a current mirror circuit comprises two transistors having their base terminals interconnected, the currents to be combined can be supplied to the collector terminals of these transistors, whilst the linear combination of these currents is defined by the fixed transmission ratio of the collector currents of the transistors and Kirchhoff's Law applied to their collector terminals. The base emitter junction of one of the transistors then simultaneously serves as a rectifier circuit.

For a multi-sided bounding of the output current range or a limitation of a plurality of currents there are provided at least a further current combination element, a further rectifier circuit and/or a further reference current, each current combination element being connected to the preceding element via one of the rectifier circuits. A two-sided limitation of the output current range can be obtained with a circuit arrangement in which both the input current and the output current are applied to the current combination element via a rectifier circuit. The same can also be achieved with an array of several current combination elements alternating with rectifier circuits in which several input currents or output currents can optionally be applied to the current combination elements and in which a reference current can also be optionally applied to each current combination element. The current ranges of the input current and the output current can be arbitrarily adjusted by a corresponding arrangement of the current combination elements and the rectifier circuit as well as by the choice of the reference currents. Since the bounding values of the current ranges correspond to the reference currents and all currents are combined linearly, the required circuit arrangement can be directly laid out and dimensionsed.

In a circuit arrangement using several current combination elements are connected to the preceding element via a current mirror arrangement comprising at least the rectifier circuit. In addition to the above-mentioned advantages of the current mirror circuit this provides the possibility of, for example a simple reversal of the current direction and hence a reversal of the sign in the linear combination of the currents. Furthermore, input, output and reference currents can be applied to or taken from circuit components, which are present outside the current limiting circuit arrangement, via current mirror circuits for the purpose of decoupling these components.

In an advantageous embodiment the circuit arrangement according to the invention comprises a transistor whose base emitter junction constitutes one of the rectifier circuits and whose collector terminal constitutes the current combination element connected to the latter circuit. The currents applied to the collector terminal are linearly superposed therein by Kirchhoff's law, whilst the current passed via the collector emitter junction of the transistor flows through the rectifier circuit constituted by the transistor. As described above the transistor may form part of a conventional current mirror. This results in a very compact, simple construction. The base terminal of the transistor may be connected to the collector terminal so that current through the base terminal does not invalidate the combination of the currents at the collector terminal serving as a current combination element. At a sufficiently high gain of the transistor and less stringent requirements on the accuracy of the currents it may also be advantageous to apply a (fixed) reference voltage to the base terminal.

According to a further embodiment the circuit arrangement according to the invention comprises a first transistor whose interconnected base and collector terminals constitute a first current combination element and whose base emitter junction constitutes a first rectifier circuit, and by a second transistor whose collector terminal constitutes a second current combination element and whose base emitter junction constitutes a second rectifier circuit, the interconnected emitter terminals of the first and second transistors constituting a third current combination element, whilst the input current and a first reference current are applied to the first current combination element, a third reference current as well as the emitter currents of the first and the second transistor are applied to the third current combination element and a second reference current and the output current are applied to the second current combination element. The first and the second transistor are interconnected as a differential amplifier with two current branches and the input current is applied to the first branch, whilst the output current is taken from the second branch. A reference voltage supplying a reference level for the supply of the input current is preferably applied to the base terminal of the second transistor. Such an arrangement effects a two-sided limitation of the output current, the first reference current constituting the lower limit value of the input current, the third reference current constituting the output current range and the second reference current constituting the upper limit value of the output current.

In a further embodiment according to the invention at least one current combination element is connected to at least one branch conveying an excess current. Such an excess current is advantageously generated when a current is produced in the circuit arrangement with which current an output current is associated in accordance with the given linear combination and whose value is outside the current range. The current difference exceeding the value assigned to the limit value of th eoutput current is then conveyed as an excess current by the said branch. Consequently, for example too high voltages at the sources supplying the reference currents nd similar signal distortions can be avoided. The excess current may also be utilized as a (further) output current which then flows in the input current range in which the output current is limited.

Advantageously, each branch conveying an excess current comprises an excess current transistor whose emitter is connected to the current combination element, whose collector is connected to a terminal of a current supply and whose base is connected to a reference voltage source. If an unwanted voltage variation occurs due to a limit value for a current being exceeded at the current combination element, which voltage variation exceeds a threshold determined by the reference voltage source, the excess current is supplemented from the current supply so that the voltage at the current combination elements does not or not essentially change.

Advantageously, the reference voltage is taken from a tapping on a first resistive voltage divider comprises by the reference voltage source and arranged between the terminal for the current supply and ground, the collector emitter junction of a transistor being arranged in parallel with said resistive voltage divider. This arrangement provides a low voltage threshold so that the excess current starts flowing already at small variations of the voltage at the current combination element. Furthermore, the transistor realises a compensation of the temperature dependence of the excess current transistor. The base terminal of the transistor arranged in parallel with the first resistive voltage divider is advantageously either connected to its collector terminal or to a tapping of a second resistive voltage divider which is arranged parallel to the collector emitter junction of this transistor. Whereas in the first case the base emitter junction of the transistor is arranged in parallel with the first resistive voltage divider and the voltage at the first resistive voltage divider is thus fixed at the forward voltage of the base emitter junction, the reference voltage taken from the first resistive voltage divider can in the second case be matched to different conditions in that the resistance of the first resistive voltage divider between the collector and emitter terminals of the transistor is twice the resistance of the part of the second resistive voltage divider arranged between the base and emitter terminals of the transistor and in that the resistance of the part of the second resistive voltage divider arranged between the collector and base terminals of the transistor is (N−1) fold the said resistance, wherein N is larger than or equal to 1.

A further improvement of the compensation of the temperature dependence of the excess current transistor may be realised in that the reference voltage is taken from the reference voltage source via the base emitter junction of a compensation transistor. In this manner two base emitter junctions are arranged in series between the current combination element and the reference voltage source, whilst the voltages across these junctions eliminate one another. This also eliminates the temperature dependence, caused by temperature-conditioned variations of these voltages, in the operating mode of the branch supplying the excess current.

In a further embodiment according to the invention a corresponding compensation can be realised in that the reference voltage source includes a transistor whose base emitter junction is arranged in parallel with a first diode poled in the forward direction and whose collector emitter junction is arranged in series with a resistor connected to the collector terminal, the base terminal of the transsistor being connected to a tapping of the resistor and the reference voltage being taken from the collector terminal. The base terminal of the transistor may be connected to the tapping of the resistor either directly or via a second diode poled in the forward direction. Such an arrangement represents a current mirror having a first branch constituted by the first and possibly the second diode and a second branch constituted by the part of the resistor arranged between the tapping and the collector of the transistor as well as by the collector emitter junction of the transistor. The current through the diodes also fixes the current through the resistor via the transistor and thereby fixes the voltage drop at ths resistor, whilst the temperature compensation is achieved by superposition in the opposite sense of the voltage at the first diode and at the base emitter junction of the transistor on the one hand and at the base emitter junction of the excess current transistor on the other hand.

Figure 2:
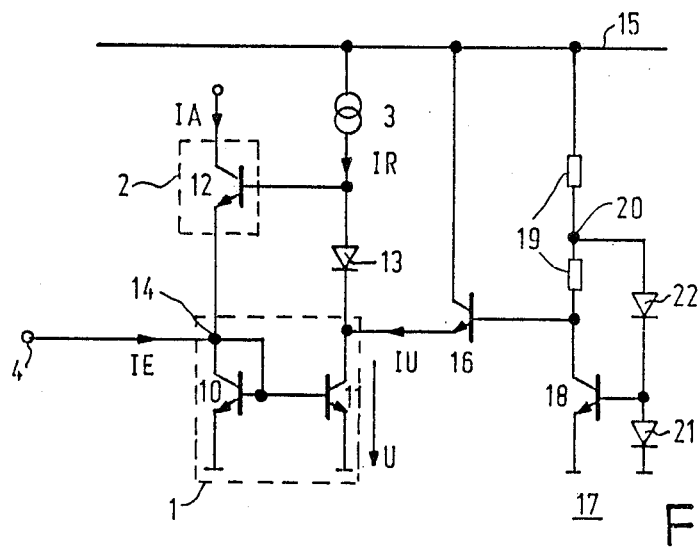
Figure 4:
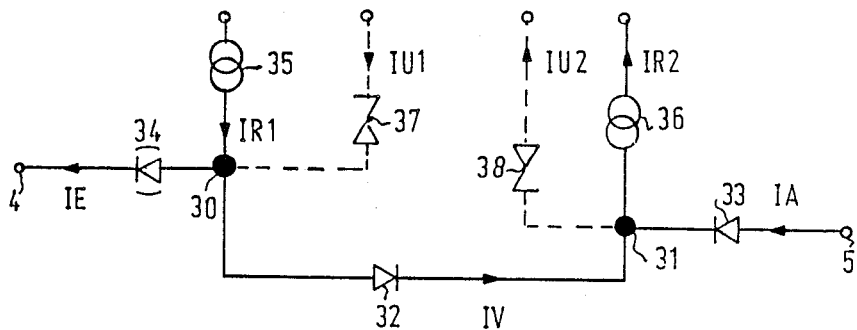
Figure 5:
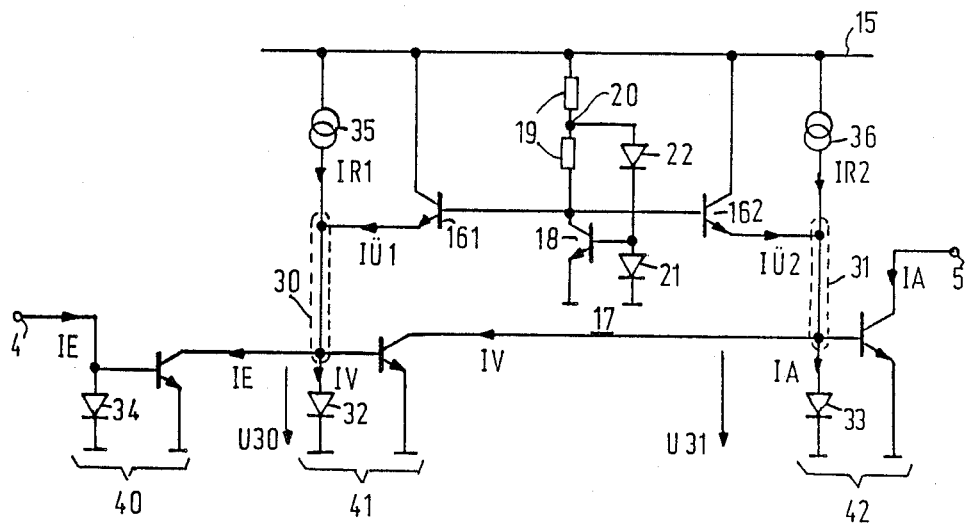
Figure 6:
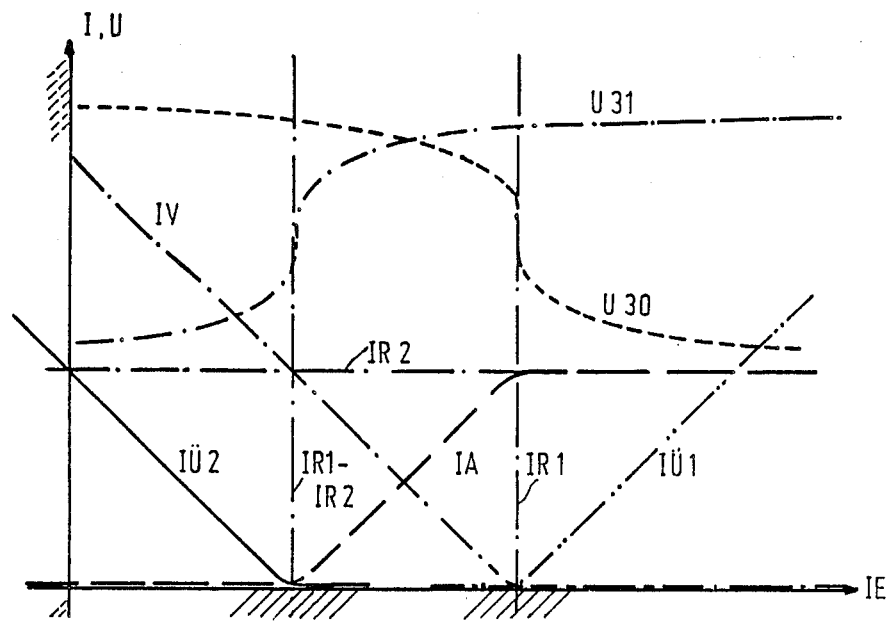
Figure 7:
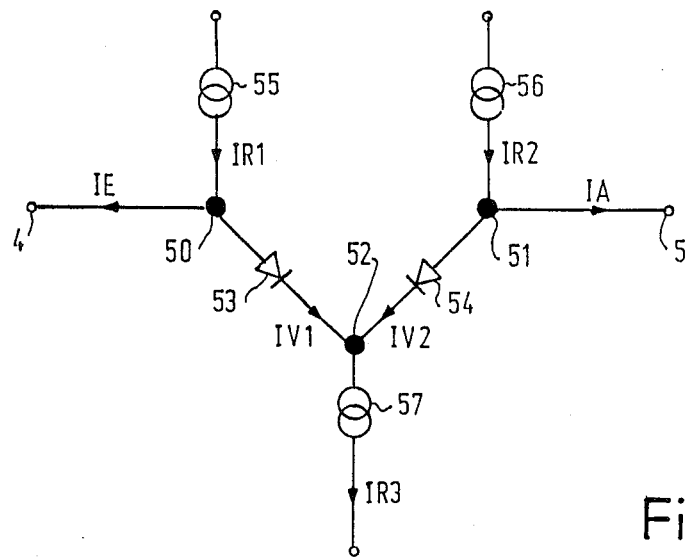
Figure 8:
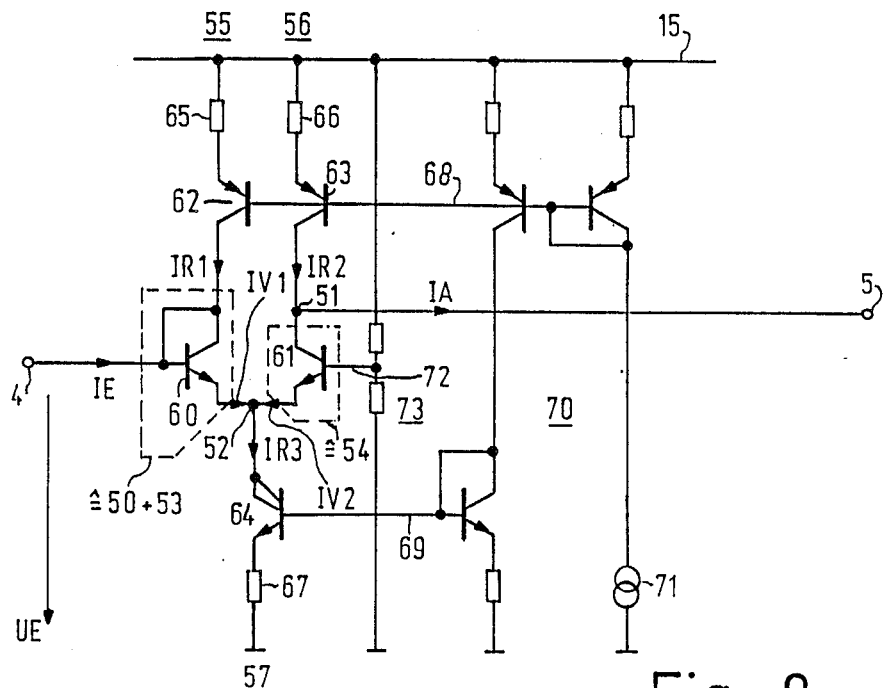
Figure 9:
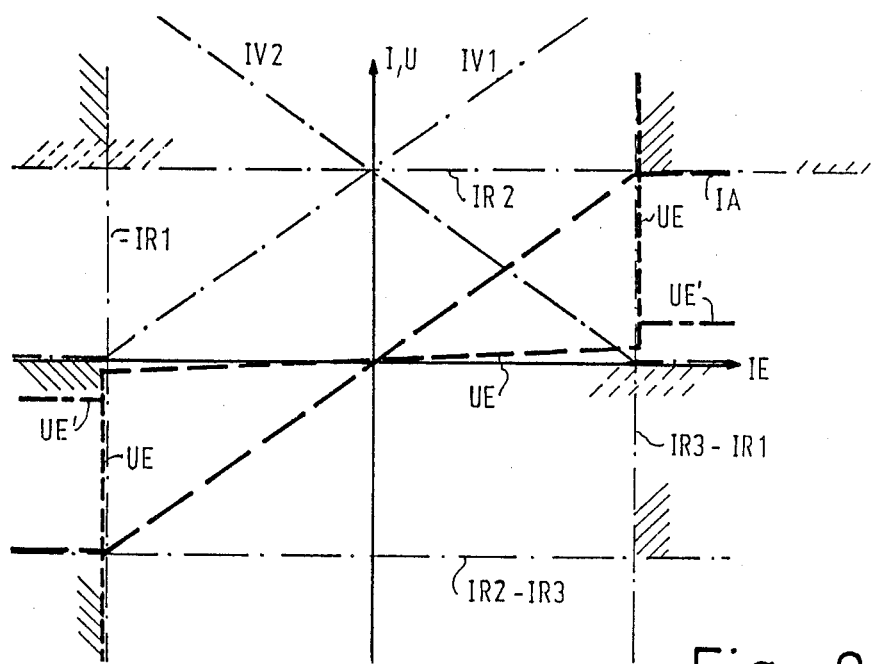

The invention will now be described in greater detail by way of example with reference to the accompanying drawings in which FIG. 1 shows a circuit diagram according to the invention, FIG. 2 shows an embodiment of a circuit arrangement according to FIG. 1, FIG. 3. shows a diagram with current and voltage waveforms relating to the circuit arrangement according to FIG. 2, FIG. 4 shows the circuit diagram of a further embodiment of the invention, FIG. 5 shows the circuit diagram of a current-limiting arrangement according to FIG. 4, FIG. 6 shows a diagram with current and voltage waveforms relating to the circuit arrangement according to FIG. 5, FIG. 7 shows the circuit diagram of a further embodiment according to the invention, FIG. 8 shows a circuit arrangement for realising the embodiment according to FIG. 7, FIG. 9 shows a diagram with current and voltage waveforms relating to the circuit arrangement according to FIG. 8, FIGS. 10 to 14 show several further elaborations of the circuit arrangement according to FIG. 8.

FIG. 1 shows a simple circuit diagram of a circuit arrangement according to the invention in which a node 1 constitutes a current combination element and a diode 2 constitutes a rectifier circuit. A fixed reference voltage IR is supplied by a current source 3. An input current IE flows from an input terminal 4 and an output current IA flows from an output terminal 5 to the node 1, the latter current flowing via the diode 2. The diode 2 may alternatively be poled in the reverse direction so that the output current IA flows from node 1 to output terminal 5. Likewise the positive direction for the input current IE may be reversed. In any case a linear combination of the two currents is obtained at the node 1 which currents also include the reference current IR by Kirchhoff's law. As the input current IE changes, the output current IA also changes with opposite sign because the linear combination of the three currents should always yield 0 by Kirchhoff's law. As a boundary condition for these changes the diode 2 makes it impossible for the output current IA to become negative. This means that the input current IE may at best assume the value of the reference current IR. Thus a simple limitation of the current ranges for the input current IE and the output current IA is created which independently of any type of current branching or saturation effects operates very directly and is thus also suitable for current having a very high frequency.

FIG. 1 also shows a branch in broken lines connected to the node 1 which is symbolically represented by a zener diode 6 and which conveys an excess current IU if a circuit (not shown) connected to to the input terminal 4 forces the input current IE to a value which exceeds the afore-described limit value produced by the diode 2. In such a case the voltage at the node 1 in the circuit arrangement according to FIG. 1 increases to infinity, assuming that there is an ideal diode 2 and an ideal current source 3, if no branch for an excess current IU is provided. With such a voltage increase the zener diode 6 becomes conducting and depletes the current exceeding the limit value.

FIG. 2 shows an embodiment of a circuit arrangement for current limitation in accordance with the principle illustrated in FIG. 1. The circuit arrangement comprises a current mirror of the conventional type consisting of a first, a second and a third current mirror transistor 10, 11 and 12, respectively, and a current mirror diode 13 which essentially serves only for potential adjustment and may also be dispensed with in a modification of the circuit arrangement shown. The collector emitter junctions of the first and the third current mirror transistors 10 and 12 are arranged in series with each other and constitute a first current branch, whilst the collector emitter junction of the second current mirror transistor 11 arranged in series with the current mirror diode 13 constitutes a second current branch. The current source 3 supplies to these branches the reference current IR and possibly the excess current IU at the junction point between the current mirror diode 13 and the second mirror transistor 11, whilst in the first current branch the output current IA flows through the third current mirror transistor 12 and the input current IE is supplied via the input terminal 4 to the junction point 14 between the emitter terminal of the third current mirror transistor 12 and the collector terminal of the first current mirror transistor 10.

The core of the current mirror 10, 11, 12 (and 13) which is constituted by the first and second current mirror transistors 10 and 11 whose base terminals are interconnected takes over the function of the current combination element 1, together with the junction point 14. In this element the reference current IR and possibly the excess current IU of the second current mirror transistor 11 is mirrored on the first current mirror transistor 10 and is superposed to a linear combination at the junction point 14 with the input and output currents IE and IA by Kirchhoff's law. The function of the rectifier circuit 2 is taken over by the base emitter junction of the third current mirror transistor 12 conveying the output current IA.

The excess current IU is taken from the positive terminal of a current supply 15 via a branch constituted by the collector emitter junction of an excess current transistor 15 and is applied to the current combination element 1. The base terminal of the excess current transistor 16 is connected to a reference voltage source 17 comprising a transistor 18, a resistor 19 with a tapping 20 and a first and a second diode 21 and 22. Resistor 19 and the collector emitter junction of the transistor 18 constitute a series circuit arranged between the positive terminal of the current supply 15 and ground, whilst the first diode 21 is arranged parallel to the base emitter junction of the transistor 18 and the second diode 22 is arranged between the tapping 20 and the base terminal of the transistor 18.

Figure 3:
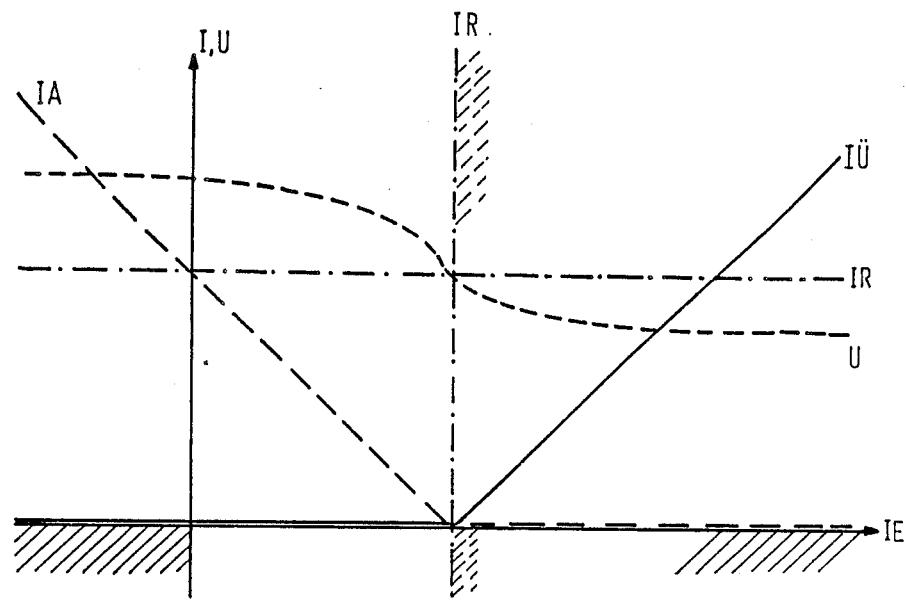

In the diagram of FIG. 3 the output current IA and the excess current IU and, on a different scale, the voltage U at the collector of the second current mirror transistor 11 are shown with respect to ground in dependence upon input current IE. The shaded area below the abscissa indicates the limitation of the current range for the output current IA to positive values, which limitation is determined by the rectifier circuit 2. This limitation corresponds to a limitation of the input current IE to a maximum value IR above which the output current IA remains constant (at the value 0) whilst for higher input currents IE the excess value is supplied by the current IU.

As long as the input current IE is smaller than the reference current IR, the voltage U across the collector emitter junction of the second current mirror transistor 11 as compared with the reference voltage applied by the reference voltage source 17 to the base terminal 16 of the excess current transistor is so large that the excess current transistor 16 is turned off and that no excess current IU can flow. However, if the input current IE reaches the value of the reference current IR, the voltage decreases so far below the reference voltage that the excess current transistor 16 is turned on and that the excess current IU starts flowing. This behaviour can clearly be recognized as a transition in the voltage characteristic.

Since the current-voltage characteristic of the base emitter junction of the excess current transistor has a strong temperature dependence, the value of the input current IE at which the excess current IU starts flowing can change with temperature in the case of a temperature-independent reference voltage at the base terminal of the excess current transistor 16 and thus cause an unwanted behaviour of the circuit arrangement. The reference voltage source is therefore formed in such a manner that the temperature dependence of the excess current transistor 16 is compensated. The diodes 21, 22 on the one hand and the part of the resistor 19 between the tapping 20 and the collector of the transistor 18 as well as the collector emitter junction of this transistor on the other hand constitute the two current branches of a current mirror. The current in the first branch constituted by the diodes 21, 22 is determined by the voltage at the positive terminal of the current supply 15 and by the part of the resistor 19 arranged between this positive terminal and the tapping 20. This current is mirrored from the first current branch into the second current branch, i.e. the collector emitter junction of the transistor 18 and generates a constant voltage drop at the part of the resistor 19 between the tapping 20 and the base terminal of the excess current transistor 16. Due to the influence of the varying temperature the voltages across the didoes 21, 22 by which the voltage variations in the same direction at the second current mirror transistor 11 and the base emitter junction of the excess current transistor 16 are compensated now change.

FIG. 4 shows the circuit diagram of a further embodiment according to the invention. It comprises a first and a second current combination element 30, 31 indicated by two nodes which are connected via a first rectifier circuit 32 represented by a diode. The input current IE is supplied from the input terminal 4. to the first node 30. In the embodiment shown the positive current direction of the input current IE is chosen to be the direction from the first node 30 to the input terminal 4. A first reference current IR1 from a first current source 35 and possibly a first excess current IU1 from a first branch are applied to the first node 30. The branch for the excess current IU1 is symbolically represented by a first zener diode 37. In a corresponding manner, the output current IA applied from the output terminal 5 via a second rectifier circuit 33, a second reference current IR2 applied from a second current source 36 as well as possibly a second excess current IU2 through a second branch—represented by a second zener diode 38—are combined in the second node 31. A connection current IV flows through the first rectifier circuit 32 from the first to the second node.

As long as the input current IE is smaller than the first reference current IR1, a connection current IV flows through the first rectifier circuit 32 which current corresponds to the difference between the first reference current IR1 and the input current IE. if the input current IE exceeds the first reference current IR1, the first branch (first zener diode 37) conveys the first excess current IU1 whereas the connection current IV constantly remains zero. On the other hand the value of the connection current IV tending to a decrease of the input current IE to negative values is not limited by the first rectifier circuit 32.

The output current IA which is limited to positive values by the second rectifier circuit 33 is formed at the second 31 from the difference between the second reference current IR2 and the connection current IV limited to positive values. The connection current IV and the output current IA then change in the opposite sense. If the connection current IV exceeds the second reference current IR2, the output current IA becomes constantly 0 and excessive connection current IV is depleted via the second branch (second zener diode 38). as a second excess current IU2. The result is an output current IA which is limited to a current range between the value 0 and IR2. The described currents are showin the diagram of FIG. 6 as functions of the input current IE.

The circuit arrangement according to FIG. 4 optionally comprises a third rectifier circuit 34 between the first node 30 and the input terminal 4. The current range for the input current IE is thereby limited to positive current values. Dependent on the choice of the values for the reference currents IR1 and IR2 determining the current range in which the input and output currents are linearly dependent on each other, a further current limitation can be achieved which may narrow this current range to a greater extent than the rectifier circuits 32 and 33. In the diagram according to FIG. 6 the limitation of the input current IE does not influence the current range of the outupu current IA because IR1 is chosen to be larger than IR2.

FIG. 5 shows an embodiment of a circuit arrangement for the practical realisation of the principle illustrated in FIG. 4. Elements already described or corresponding elements have the same reference designations. The input current IE is applied to the first node 30 from the input terminal 4 via a first current mirror 40 which decouples the input terminal 4 and reverses the direction of the input current IE. In this node a linear combination is effected of the input current IE with the first reference current IR1 from the first current source 35 and possibly with the first excess current IU1 to form the connection current IV. This connection current is applied via a second current mirror 41 to the second node 31 and combined therein with the second reference current IR2 and possibly with the second excess current IU2 to form the output current IA. The output current IA is mirrored via a third current mirror 42 at the output terminal 5. The current mirrors 41, 42, which likewise as the current mirror 40 each comprise a diode and a transistor, constitute with their diodes the rectifier circuits 32 and 33 (and optionally 34) and with their junction points between the base terminal of the associated transistor and the diode they constitute the current combination elements 30, 31 (nodes). At a high grain of the transistors their collector currents are essentially equal to the currents in the associated diodes so that transmission errors are minimized.

The excess currents IU1 and IU2 are applied to the nodes 30 and 31, respectively, from the positive terminal of the current supply 15 via a first and a second excess current transistor 161, 162, respectively, A reference voltage generated in a reference voltage source 17 identical to the source shown in FIG. 2 is applied to the base terminals of the excess current transistors 161, 162.

The current diagram of FIG. 6 shows on a different scale the voltages U30 and U31 at the nodes 30 and 31 in dependence upon the input current IE. Each voltage has the voltage step described with reference to FIG. 4 which is combined with the start of the associated excess currents IU1 and IU2, respectively.

In FIG. 6 the value of the first reference current IR1 is equal to twice the value of the second reference current IR2. By choosing different values for the reference currents the current ranges for the input and output currents can be changed as desired. The direct current value by which the values of the output current IA with respect to the values of the input current IE in the range of linear dependence are shifted between the two currents can also be adapted if desired.

FIG. 7 shows the circuit diagram of a further embodiment according to the invention in which a first, a second and a third node 50, 51, 52 each constituting a current combination element are pairwise interconnected via a first and a second rectifier circuit 53 and 54, respectively. In the first node 50 the input current IE and a first reference current IR1 from a first current source 55 are linearly combined to a first connection current IV1 which flows to the third node 52 via the first rectifier circuit 53. In a corresponding manner a second reference current IR2 from a second current source 56 is combined in the second node 51 with the output current IA flowing to the output terminal 5 to form a second connection current IV2 which is combined in the third node 52 with the first connection current IV1 and a third reference current IR3 from a third current source 57. The first node 50 and the first rectifier circuit 53 jointly limit the input current IE to a current range above the negative value of the first reference current IR1. In a corresponding manner the second rectifier circuit 54, in connection with the first and the third reference current RI1 and IR3 and the first node 50, limits the current range of the input current IE in a positive sense to a value which corresponds to the difference IR3-IR1 of the third and the first reference current. By co-operation of the second reference current IR2 from the second current source and the second rectifier circuit 54 via the second node 51 the output current IA is additionally limited in its current range to values which are smaller than the second reference current IR2. In FIG. 9 the described currents are plotted as functions of the input current IE in a diagram, and this for the exceptional case where the first and the second reference current IR1 and IR2 correspond to each other and are half as large as the third reference current IR3. By a changed choice of the reference currents the current ranges can also be varied in this case.

FIG. 8 shows a detailed embodiment of an arrangement in accordance with the principle illustrated in FIG. 7. Components already described have the same reference designations. The circuit arrangement comprises a first and a second transistor 60 and 61 whose emitters are interconnected as a differential amplifier at the node 52. The input current IE is applied from the input terminal 4 to the base terminal of the first transistor 60 whilst the first reference current IR1 is applied to the collector terminal. The base and collector terminals are interconnected. The first transistor 60 thereby takes over the function of the first node 50 on the one hand and its base emitter junction takes over the function of the first recitifier circuit 53 on the other hand. The first connection current IV1 flows from its emitter terminal to the third node 52.

The collector terminal of the second transistor 61 is connected to the second node 51 at which the second reference current IR2 and the output current IA2 are combined to form the second connection current IV2 which is applied from the emitter terminal of the second transistor 61 to the third node 52 to which also the third reference current IR3 is applied.

The current sources 55, 56, 57 are constituted by current source transistors 62, 63, 64, respectively, whose collector emitter junctions are series-arranged with current source resistors 65, 66 and 67 which are connected to the emitter terminals of the associated current source transistors 62, 63 and 64, respectively. The first and the second current source transistor 62, 63 are driven at their base terminals via a common first control lead 68 and the third current source transistor 64 is driven via a second control lead 69 from a reference current mirror 70 by a common reference current source 71. To achieve a third reference current IR3 which has twice the value as compared with the first and the second reference currents IR1 and IR2, the semiconductor junctions of the third current source transistor 64 are doubled with respect to those of the first and second current source transistors 62 and 63, which is symbolized in FIG. 8 by means of two collector terminals.

The base terminal of the second transistor 61 is connected to the tapping 72 of a resistive voltage divider 73 which is arranged between the positive terminal of the current supply 15 and ground so that the base terminal of the second transistor 61 has a fixed voltage potential.

The current diagram of FIG. 9 also shows on a different scale the input voltage Ue between the input terminal 4 and ground in dependence upon the input current IE. The value assumed by the input voltage UE upon disappearance of the input current IE is located at the zero point of the current diagram. The voltage UE varies in the current range of the input current IE to a slight extent only, but it increases steeply when it reaches one of the current limitations. This considerable voltage increase becomes detrimentally manifest particularly at high frequencies in that it reversely charges the inevitably parasitic capacitances, particularly of the first transistor 60. In order to avoid the resultant limitations of the amplitude-frequency curve of the circuit arrangement it is desirable to eliminate these excessive voltage increases. For example a waveform as illustrated in FIG. 9 by the curve branches denoted by UE' would be desirable.

Such a voltage variation is also achieved in the relevant embodiment by the arrangement of branches conveying an excess current. An example is shown in FIG. 10 which is an elaboration of the circuit arrangement according to FIG. 8 and which shows only those elements which are connected to the branches conveying an excess current.

The branches conveying an excess current are again constituted by excess current transistors and the collector emitter junction of a first excess current transistor 80 is arranged between the positive terminal of the current supply 15 and the input terminal 4 and a second excess current transistor 81 is arranged with its emitter collector junction between the input terminal 4 and ground. In the relevant embodiment the first excess current transistor 80 is of the npn type and the second excess current transistor 81 is of the pnp type. The base terminals of the excess current transistors 80, 81 are connected to the tapping 72 on the resistive voltage divider 73.

If no input current IE flows, the voltages at the input terminal 4 and at the tapping 72 correspond to each other so that no voltage is present at the base emitter junctions of the excess current transistors 80, 81 and hence there flows no current. Neither are any excess currents produced in the excess current transistors 80, 81 by the small changes of the input voltage UE which occur within the current ranges of the input current IE and the output current IA. These excess currents only occur when the voltage across the base emitter junction of one of the transistors 80, 81 exceeds the forward voltage of the base emitter diode of the relevant transistors, for example 0.7 V. Then an excess current flows in the first excess current transistor 80 when the input voltage UE at the input terminals 4 falls, for example 0.7 V below the reference voltage at the tapping 72, and conversely a current flows in the second excess current transistor 81 when the voltage UE exceeds the reference voltage at the tapping 72 by, for example 0.7 V. If the input current IE then exceeds the current range in which the output current IA is linearly dependent on this input current, the voltage variations designated by UE' in FIG. 9 are obtained at the input terminal 4.

Figure 10:
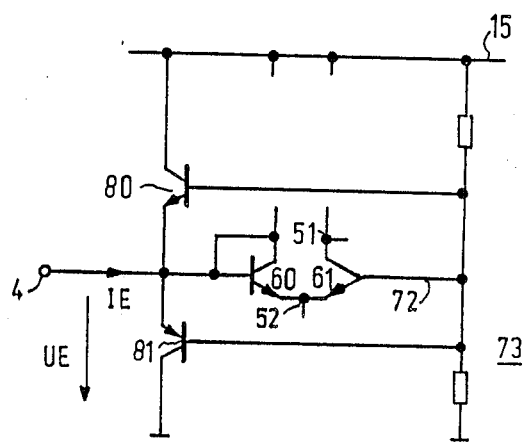

In the circuit arrangement according to FIG. 10 the range of variations of the input voltage UE is twice the forward voltage of one of the base emitter diodes of the excess current transistors 80, 81. For the reasons mentioned it may be desirable to reduce this range of variations to a still further extent. The envisaged object of this reduction is a complete disappearance of the voltage step between the variation of the input voltage UE in the current range and the curve branches UE'. For reasons of eliminating tolerances in the manufacture of the described circuit it may also be advantageous to maintain a voltage step, though being small, which then eliminates spreads in the variation of the input voltage UE in the limited current range so that a premature initiation of an excess current may be avoided.

Figure 11:
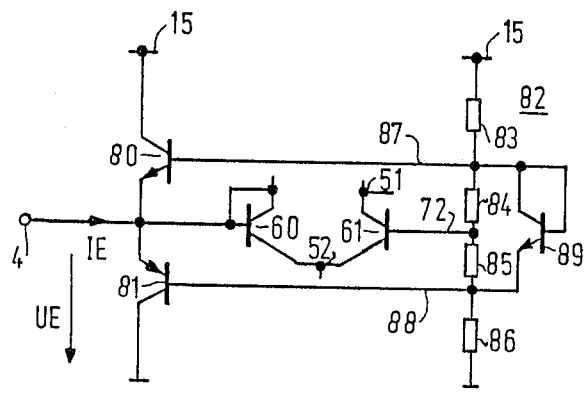

FIG. 11 shows a possibility of reducing the range of variations of the input voltage UE. Instead of the resistive voltage divider 73 a modified voltage divider 82 comprising four resistors 83, 84, 85, 86 is used for this purpose. Between the second resistor 84 and the third resistor 85 of this voltage divider 82 the tapping 72 is connected to the base terminal of the second transistor 61. The base terminals of the excess current transistors 80 and 81 are connected to two further tappings 87, 88 between the first resistor 83 and the second resistor 84 and between the third resistor 85 and the fourth resistor 86, respectively, of the voltage divider 82. The collector emitter junction of a transistor 89 arranged as a diode in the embodiment of FIG. 11 is arranged in parallel with the second and third resistors 84, 85 of the voltage divider 82, thus between the tappings 87 and 88, which means that in this embodiment also the base terminal of the transistor 89 is connected to the first tapping 87. Consequently, the voltage between the first tapping 87 and the second tapping 88 is fixed at the forward voltage of the base emitter diode of the transistor 89. The voltage swing of the input voltage UE at the input terminals 4, starting from the voltage value without an input current IE, then only amounts to half the forward voltage of a base emitter diode of the transistors 80, 81 and 89. The circuit arrangement according to FIG. 11 has the additional advantage that in the case of operating temperature fluctuations in the circuit arrangement the changes of the forward voltages of the base emitter diodes in the transistors 80, 81 on the one hand and 89 on the other hand partially compensate one another so that a reduction of the temperature dependence on the limits of the voltage swing of the input voltage UE is realised.

Figure 12:
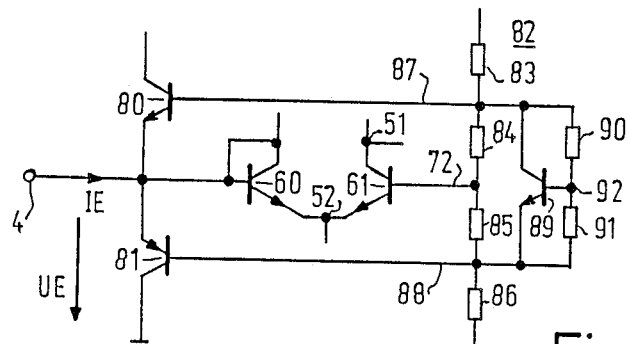

Whereas in the circuit arrangement according to FIG. 11 the limits of the voltage swing of the input voltage UE are fixed by the transistor 89, an elaboration of this arrangement according to FIG. 12 provides the advantage of an adjustable voltage swing for the input voltage UE. To this end the base terminal of the transistor 89 is connected to the junction point 92 of the two series-arranged resistors, namely a fifth resistor 90 and a sixth resistor 91 which jointly constitute a second resistive voltage divider bridging the tappings 87 and 88 of the voltage divider 82. For the purpose of adjusting the voltage between the first tapping 87 and the second tapping 88, the second, third and sixth resistors 84, 85 and 91 are preferably fixed at a corresponding value R, whilst the fifth resistor 90 acquires a value $(N-1)R$. Here N is a variable which can be changed to adjust the voltage between the first tapping 87 and the second tapping 88.

Figure 13:
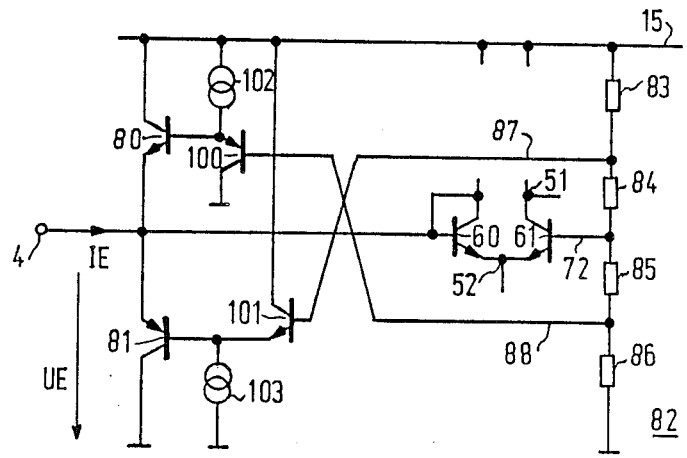

A still better compensation of the temperature dependence of the forward voltages of the base emitter diodes of the excess current transistors 80, 81 causing the temperature-dependent variation of the voltage swing of the input voltage UE is obtained, for example by means of a circuit arrangement as is shown in FIG. 13. Unlike FIGS. 11 and 12, the transistor 89 and the second resistive voltage divider 90, 91 are omitted and instead the tappings 87, 88 of the voltage divider 82 are connected via the base emitter junctions of compensation transistors 100 and 101 to the base terminals of the first and the second excess current transistors 80 and 81, respectively. More specifically, the second tapping 88 is combined with the base terminal of the first compensation transistor 100 and its emitter terminal is combined with the base terminal of the first excess current transistor 80, whilst the first tapping 87 is combined with the base terminal of the second compensation transistor 101 and its emitter terminal is combined with the base terminal of the second excess current transistor 81. The collector emitter junction of the first compensation transistor 100 is arranged in series between the positive terminal of the current supply 15 and ground with a first operating current source 102 connected to the associated emitter terminal, and the collector emitter junction of the second compensation transistor 101 is correspondingly arranged in series between the positive terminal of the current supply 15 and ground with a second operating current source 103 connected to the emitter terminal of this compensation transistor 101. The currents supplied by the operating current sources 102, 103 are set in such a way that the collector emitter junctions of the compensation transistors 100, 101 convey a current and that the forward voltage drops off via the base emitter diodes of these transistors and this independently of the value of the input voltage UE. These forward voltage then exactly compensate the forward voltages via the base emitter diodes of the associated excess current transistors 80 and 81 so that the voltage swing of the input voltage UE becomes independent of temperature. It is determined by the choice of the values of the voltage divider 82, particularly by the value of the second and the third resistor 84 and 85.

Figure 14:
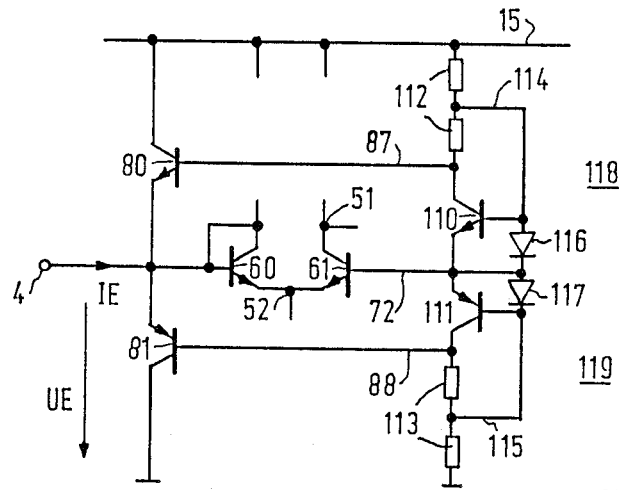

FIG. 14 shows a further possibility of ensuring a temperature-independent voltage swing for the input voltage UE, using fewer components as compared with the embodiment of FIG. 13. Starting from an arrangement as shown in any one of FIGS. 10 to 12, the resistive voltage divider 73 and the voltage divider 82 are replaced by a series arrangement of a voltage divider 118 between the positive terminal of the current supply 15 and the tapping 72 and a voltage divider 119, respectively between the tapping 71 and ground. Each of these voltage divider 118, 119 corresponds to the reference voltage source 17 described with reference to FIG. 2, but in the embodiment of FIG. 14 the second diode 22 which is present in the reference voltage source 17 as shown in FIG. 2 is omitted and for the second voltage divider 119 the polarities of the associated transistor 111 and the diode 117 are reversed with respect to the embodiment of the reference voltage source 17 and the first voltage divider 118. Otherwise, resistors 112, 113 correspond to the resistor 19, transistors 110, 111 correspond to the transistor 18, diodes 116 and 117 correspond to the first diode 21 and tappings 114 and 115 correspond to the tapping 20. By the omission of diodes corresponding to the second diode 22 in the reference voltage source 17 the voltage between the tapping 72 and the tapping 114 on the one hand and the tapping 115 on the other hand is only as large as a diode forward voltage. This voltage compensates the forward voltage of the base emitter diode of the first and the second excess current transistors 80 and 81, respectively. The allowed voltage swing of the input voltage UE is again determined by the resistors 112, 113, particularly by the choice of the values of the resistive components between the tappings 114 and 87 and between 88 and 113, respectively.

What is claimed is:

1. A circuit arrangement for deriving an output current in an output terminal from an input current in an input terminal, the output current being limited to a current range, comprising first and second transistors, each having a base electrode, an emitter electrode and a collector electrode; a first current source, a second current source, and a third current source, the base electrode and the collector electrode of the first transistor being interconnected, and coupled to the input terminal and to said first current source, the collector electrode of the second transistor being coupled to said second current source and to the output terminal, and the base electrode of the second transistor being coupled to a reference voltage, and the emitter electrodes on said transistors being interconnected and coupled to said third current source, further comprising an excess current transistor having a base electrode coupled to a reference voltage source, an emitter electrode coupled to the input terminal and a collector electrode coupled to a current supply terminal.

2. A circuit as claimed in claim 1 in which the reference voltage source comprises a first resistive voltage divider, the excess current transistor base electrode being coupled to the reference voltage source by a tapping on said first resistive voltage divider, further comprising a third transistor having a base electrode, an emitter electrode and a collector electrode and providing a collector-to-emitter path, arranged such that its collector-to-emitter path is in parallel with the first resistive voltage divider.

3. A circuit arrangement as claimed in claim 2 in which the base and collector electrodes of the third transistor are interconnected.

4. A circuit arrangement as claimed in claim 2 in which the voltage source comprises a second resistive voltage divider which is arranged in parallel with the collector-to-emitter electrode path of the first transistor and which has a tapping connected to the base electrode of the third transistor.

5. A circuit arrangement as claimed in claim 4, wherein the resistance of the first resistive voltage divider between the collector and the emitter electodes of the third transistor is twice the resistance of a first part of the second resistive voltage divider which is arranged between the base and emitter electrodes of the third transistor, and the resistance of the second part of the second resistive voltage divider which is arranged between the collector and base electrodes of the first transistor is a multiple of (N−1) times the resistance of the said first part, where N is larger than or equal to 1.

6. A circuit arrangement as claimed in claim 5, including a compensation transistor, the reference voltage being taken from the reference voltage source via a base-emitter junction of the compensation transistor.

7. A circuit arrangement as claimed in claim 6 in which the reference voltage source includes a reference transistor having a base electrode, an emitter electrode and a collector electrode, a base-emitter junction arranged in parallel with a first diode arranged with a forward polarity, and a collector-emitter junction arranged in series with a resistor connected to the collector electrode of the reference transistor, the base electrode of the reference transistor being coupled to a tapping of the resistor and the reference voltage being taken from the collector electrode of the reference transistor.

8. A circuit arrangement claimed in claim 7 in which the base electrode of the reference transistor is connected to the tapping of the resistor via a second diode arranged with a foward polarity.

9. A circuit arrangement for deriving an output current in an output terminal from an input current in an input terminal, the output current being limited to a current range, comprising first and second transistors, each having a base electrode, an emitter electrode and a collector electrode; a first reference current source, a second reference current source, and a third current source,
   the base electrode and the collector electrode of the first transistor being interconnected, and coupled to the input terminal and to said first reference current source, said first reference current source being a lower limit for said input current; the collector electrode of the second transistor being coupled to the second reference current source and to the output terminal, said second reference current source being an upper limit for said output current; and the base electrode of the second transistor being coupled to a reference voltage, and
   the emitter electrodes on said transistors being interconnected and coupled to said third current source, said third current source constituting the output current range.

10. A circuit as claimed in claim 9, comprising an excess current transistor having a base electrode coupled to a reference voltage source, an emitter electrode coupled to the input terminal and a collector electrode coupled to a current supply terminal, and
   said reference voltage source comprising a first resistive voltage divider, the excess current transistor base electrode being coupled to the reference voltage source by a tapping on said first resistive voltage divider.

11. A circuit as claimed in claim 9, further comprising a third transistor having a base electrode, an emitter electrode and a collector electrode and providing a collector-to-emitter path, arranged such that its collector-to-emitter path is in parallel with the first resistive voltage divider, said base and collector electrodes of the third transistor being interconnected.

12. A circuit as claimed in claim 9, further comprising a third transistor having a base electrode, an emitter electrode and a collector electrode and providing a collector-to-emitter path, arranged such that its collector-to-emitter path is in parallel with the first resistive voltage divider,
   said reference voltage source comprising a second resistive voltage divider which is arranged in parallel with the collector-to-emitter electrode path of the first transistor and which has a tapping connected to the base electrode of the third transistor.

13. A circuit arrangement as claimed in claim 12, wherein the resistance of the first resistive voltage divider between the collector and the emitter electrodes of the third transistor is twice the resistance of a first part of the second resistive voltage divider which is arranged between the base and emitter electrodes of the third transistor, and
   the resistance of the second part of the second resistive voltage divider which is arranged between the collector and base electrodes of the first transistors is a multiple of (N−1) times the resistance of the said first part, where N is larger than or equal to 1.

14. A circuit arrangement as claimed in claim 13, including a compensation transistor, the reference voltage being taken from the reference voltage source via a base-emitter junction of the compensation transistor.

15. A circuit arrangement as claimed in claim 14 in which the reference voltage source includes a reference transistor having a base electrode, an emitter electrode and a collector electrode, a base-emitter junction arranged in parallel with a first diode arranged with a forward polarity, and a collector-emitter junction arranged in series with a resistor connected to the collector electrode of the reference transistor,
   the base electrode of the reference transistor being coupled to a tapping of the resistor and the reference voltage being taken from the collector electrode of the reference transistor.

16. A circuit arrangement claimed in claim 15 in which the base electrode of the reference transistor is connected to the tapping of the resistor via a second diode arranged with a forward polarity.

17. A circuit arrangement for deriving an output current in an output terminal from an input current in an input terminal, the output current being limited to a current range, comprising first and second transistors, each having a base electrode, an emitter electrode and a collector electrode; a first reference current source, a second reference current source, and a third current source,
   the base electrode and the collector electrode of the first transistor being interconnected, and coupled to the input terminal and to said first reference current source, said first reference current source being a lower limit for said input current; the collector electrode of the second transistor being coupled to the second reference current source and to the output terminal, said second reference current source being an upper limit for said output current; and the base electrode of the second transistor being coupled to a reference voltage, and
   the emitter electrodes on said transistors being interconnected and coupled to said third current source, said third current source constituting the output current range,
   further comprising a first excess current transistor having a base electrode coupled to a first reference voltage source, an emitter electrode coupled to the input terminal and a collector electrode coupled to a first current supply terminal, and
   a second excess current transistor having a base electrode coupled to a second reference voltage source, an emitter electrode coupled to the input terminal, and a collector electrode coupled to a second current supply terminal.

18. A circuit as claimed in claim 17, further comprising a resistive voltage divider having a tapping which is said first and second reference voltage sources, said base electrode of said second transistor being coupled to said tapping.

19. A circuit as claimed in claim 17, further comprising a third transistor having a base electrode, an emitter electrode and a collector electrode and providing a collector-to-emitter path, arranged such that its collector-to-emitter path is in parallel with the first resistive voltage divider, said base and collector electrodes of the third transistor being interconnected.

20. A circuit as claimed in claim 17, further comprising a third transistor having a base electrode, an emitter electrode and a collector electrode and providing a collector-to-emitter path, arranged such that its collector-to-emitter path is in parallel with the first resistive voltage divider,
said reference voltage source comprising a second resistive voltage divider which is arranged in parallel with the collector-to-emitter electrode path of the first transistor and which has a tapping connected to the base electrode of the third transistor.

* * * * *